(12) United States Patent
Craven et al.

(10) Patent No.: US 9,039,834 B2
(45) Date of Patent: May 26, 2015

(54) NON-POLAR GALLIUM NITRIDE THIN FILMS GROWN BY METALORGANIC CHEMICAL VAPOR DEPOSITION

(75) Inventors: Michael D. Craven, San Jose, CA (US); James Stephen Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/151,491

(22) Filed: Jun. 2, 2011

(65) Prior Publication Data
US 2011/0229639 A1    Sep. 22, 2011

Related U.S. Application Data

(63) Continuation of application No. 10/413,691, filed on Apr. 15, 2003, now abandoned.

(60) Provisional application No. 60/372,909, filed on Apr. 15, 2002.

(51) Int. Cl.
| | | |
|---|---|---|
| *C30B 25/18* | (2006.01) | |
| *C30B 29/40* | (2006.01) | |
| *C30B 25/02* | (2006.01) | |

(Continued)

(52) U.S. Cl.
CPC ............. *C30B 29/403* (2013.01); *C30B 25/02* (2013.01); *C30B 25/04* (2013.01); *C30B 25/105* (2013.01); *C30B 25/18* (2013.01); *C30B 29/406* (2013.01); *C30B 29/605* (2013.01); *H01L 21/0237* (2013.01); *H01L 21/0242* (2013.01); *H01L 21/02433* (2013.01); *H01L 21/02458* (2013.01); *H01L 21/0254* (2013.01);

(Continued)

(58) Field of Classification Search
CPC ..................... H01L 21/0262; H01L 21/02639; H01L 21/02647; H01L 21/0254; H01L 21/02458; C30B 29/403; C30B 25/02; C30B 25/04; C30B 25/105; C30B 25/18; C30B 29/406; C30B 29/605
USPC ............. 117/84, 88, 89, 90, 93, 94, 102, 104, 117/105, 106, 952
See application file for complete search history.

(56) References Cited

U.S. PATENT DOCUMENTS

| | | |
|---|---|---|
| 5,290,393 A | 3/1994 | Nakamura |
| 5,432,808 A | 7/1995 | Hatano et al. |

(Continued)

FOREIGN PATENT DOCUMENTS

| | | |
|---|---|---|
| EP | 0 942 459 | 4/1998 |
| EP | 1335434 | 8/2003 |

(Continued)

OTHER PUBLICATIONS

Board of Patent Appeals and Interference, Decision in U.S. Appl. No. 10/413,691 (2013).*

(Continued)

*Primary Examiner* — Matthew Song
(74) *Attorney, Agent, or Firm* — Gates & Cooper LLP

(57) ABSTRACT

Non-polar $(11\bar{2}0)$ a-plane gallium nitride (GaN) films with planar surfaces are grown on $(1\bar{1}02)$ r-plane sapphire substrates by employing a low temperature nucleation layer as a buffer layer prior to a high temperature growth of the non-polar $(11\bar{2}0)$ a-plane GaN thin films.

13 Claims, 4 Drawing Sheets

(51) Int. Cl.
*C30B 25/04* (2006.01)
*C30B 25/10* (2006.01)
*C30B 29/60* (2006.01)
*H01L 21/02* (2006.01)

(52) U.S. Cl.
CPC ..... *H01L 21/02609* (2013.01); *H01L 21/0262* (2013.01); *H01L 21/02639* (2013.01); *H01L 21/02647* (2013.01)

(56) References Cited

U.S. PATENT DOCUMENTS

| | | |
|---|---|---|
| 5,468,678 A | 11/1995 | Nakamura et al. |
| 5,725,674 A | 3/1998 | Moustakas et al. |
| 5,777,350 A | 7/1998 | Nakamura et al. |
| 5,923,950 A | 7/1999 | Ishibashi et al. |
| 5,926,726 A | 7/1999 | Bour et al. |
| 6,045,626 A | 4/2000 | Yano et al. |
| 6,051,849 A | 4/2000 | Davis et al. |
| 6,064,078 A | 5/2000 | Northrup et al. |
| 6,069,021 A | 5/2000 | Terashima et al. |
| 6,072,197 A | 6/2000 | Horino et al. |
| 6,086,673 A | 7/2000 | Molnar |
| 6,153,010 A | 11/2000 | Kiyoku et al. |
| 6,156,581 A | 12/2000 | Vaudo et al. |
| 6,177,057 B1 | 1/2001 | Purdy |
| 6,177,292 B1 | 1/2001 | Hong et al. |
| 6,180,270 B1 | 1/2001 | Cole et al. |
| 6,201,262 B1 | 3/2001 | Edmond et al. |
| 6,218,280 B1 | 4/2001 | Kryliouk et al. |
| 6,229,151 B1 | 5/2001 | Takeuchi et al. |
| 6,259,122 B1 | 7/2001 | Ota et al. |
| 6,265,089 B1 | 7/2001 | Fatemi et al. |
| 6,268,621 B1 | 7/2001 | Emmi et al. |
| 6,271,104 B1 | 8/2001 | Razeghi et al. |
| 6,298,079 B1 | 10/2001 | Tanaka et al. |
| 6,316,785 B1 | 11/2001 | Nunoue et al. |
| 6,350,666 B2 | 2/2002 | Kryliouk et al. |
| 6,413,627 B1 | 7/2002 | Motoki et al. |
| 6,440,823 B1 | 8/2002 | Vaudo et al. |
| 6,441,391 B1 | 8/2002 | Ohno et al. |
| 6,447,604 B1 | 9/2002 | Flynn et al. |
| 6,468,882 B2 | 10/2002 | Motoki et al. |
| 6,569,704 B1 | 5/2003 | Takeuchi et al. |
| 6,580,736 B1 | 6/2003 | Yoshie et al. |
| 6,582,986 B2 | 6/2003 | Kong et al. |
| 6,586,316 B2 | 7/2003 | Tsuda et al. |
| 6,590,336 B1 | 7/2003 | Kadota |
| 6,599,362 B2 | 7/2003 | Ashby et al. |
| 6,602,763 B2 | 8/2003 | Davis et al. |
| 6,623,560 B2 | 9/2003 | Biwa et al. |
| 6,627,552 B1 | 9/2003 | Nishio et al. |
| 6,635,901 B2 | 10/2003 | Sawaki et al. |
| 6,645,295 B1 | 11/2003 | Koike et al. |
| 6,847,057 B1 | 1/2005 | Gardner et al. |
| 6,849,472 B2 | 2/2005 | Krames et al. |
| 6,882,051 B2 | 4/2005 | Majumdar et al. |
| 6,900,070 B2 | 5/2005 | Craven |
| 6,951,695 B2 | 10/2005 | Xu et al. |
| 6,969,426 B1 | 11/2005 | Bliss et al. |
| 6,977,953 B2 | 12/2005 | Hata et al. |
| 6,996,147 B2 | 2/2006 | Majumdar et al. |
| 7,057,211 B2 | 6/2006 | Dwilinski et al. |
| 7,091,514 B2 * | 8/2006 | Craven et al. ............. 257/14 |
| 7,132,730 B2 | 11/2006 | Dwilinski et al. |
| 7,186,302 B2 | 3/2007 | Chakraborty et al. |
| 7,208,096 B2 | 4/2007 | Akkipeddi et al. |
| 7,220,658 B2 | 5/2007 | Haskell et al. |
| 2001/0011935 A1 * | 8/2001 | Lee et al. ............. 333/193 |
| 2001/0029086 A1 | 10/2001 | Ogawa et al. |
| 2001/0039104 A1 | 11/2001 | Tsuda et al. |
| 2002/0005593 A1 | 1/2002 | Bourret-Courchesne |
| 2002/0015866 A1 | 2/2002 | Hooper et al. |
| 2002/0020341 A1 * | 2/2002 | Marchand et al. ............. 117/84 |
| 2002/0027933 A1 | 3/2002 | Tanabe et al. |
| 2002/0039374 A1 | 4/2002 | Onomura et al. |
| 2002/0047113 A1 | 4/2002 | Ohno et al. |
| 2002/0069817 A1 | 6/2002 | Mishra et al. |
| 2002/0074552 A1 | 6/2002 | Weeks et al. |
| 2002/0098641 A1 | 7/2002 | Tsuda et al. |
| 2002/0144645 A1 | 10/2002 | Kim et al. |
| 2002/0187356 A1 | 12/2002 | Weeks et al. |
| 2003/0020079 A1 | 1/2003 | Hata et al. |
| 2003/0024475 A1 | 2/2003 | Anderson |
| 2003/0114017 A1 | 6/2003 | Wong et al. |
| 2003/0198837 A1 | 10/2003 | Craven et al. |
| 2003/0213964 A1 | 11/2003 | Flynn et al. |
| 2004/0094773 A1 | 5/2004 | Kiyoku et al. |
| 2004/0108513 A1 | 6/2004 | Narukawa et al. |
| 2004/0135222 A1 | 7/2004 | Alfano et al. |
| 2005/0142391 A1 | 6/2005 | Dmitriev et al. |
| 2005/0161697 A1 | 7/2005 | Nakahata et al. |
| 2005/0205884 A1 | 9/2005 | Kim et al. |
| 2005/0214992 A1 | 9/2005 | Chakraborty et al. |
| 2005/0245095 A1 | 11/2005 | Haskell et al. |
| 2005/0258451 A1 | 11/2005 | Saxler et al. |
| 2006/0043396 A1 | 3/2006 | Tsuda et al. |

FOREIGN PATENT DOCUMENTS

| | | |
|---|---|---|
| EP | 1385196 | 1/2004 |
| JP | 03-003233 | 1/1991 |
| JP | 05-183189 | 7/1993 |
| JP | 09-116225 | 5/1997 |
| JP | 10-135576 | 5/1998 |
| JP | 10135576 | 5/1998 |
| JP | 10-312971 | 11/1998 |
| JP | 11-191657 | 7/1999 |
| JP | 11191637 | 7/1999 |
| JP | 11-261169 | 9/1999 |
| JP | 11-297630 | 10/1999 |
| JP | 11-340580 | 12/1999 |
| JP | 11-346002 | 12/1999 |
| JP | 11340580 | 12/1999 |
| JP | 2000-068609 | 3/2000 |
| JP | 2000-216502 | 4/2000 |
| JP | 2000-216497 | 8/2000 |
| JP | 2000232239 | 8/2000 |
| JP | 2000-277855 | 10/2000 |
| JP | 2000277855 | 10/2000 |
| JP | 2000294827 | 10/2000 |
| JP | 2001-007394 | 1/2001 |
| JP | 2001-007396 | 1/2001 |
| JP | 2001007396 | 1/2001 |
| JP | 2001010898 | 1/2001 |
| JP | 2001024221 | 1/2001 |
| JP | 2001148533 | 5/2001 |
| JP | 2001-160656 | 6/2001 |
| JP | 2001 257166 | 9/2001 |
| JP | 2001-298215 | 10/2001 |
| JP | 2001342100 | 11/2001 |
| JP | 2002-94113 | 3/2002 |
| JP | 2002076521 | 3/2002 |
| JP | 2002-100838 | 4/2002 |
| JP | 2002-111134 | 4/2002 |
| JP | 2002 076329 | 9/2002 |
| JP | 2003-060298 | 2/2003 |
| JP | 2003-060319 | 2/2003 |
| JP | 2003-124573 | 4/2003 |
| JP | 2006-310403 | 11/2006 |
| KR | 10-0992960 | 11/2010 |
| WO | 03/035945 | 5/2003 |
| WO | 03/089694 | 10/2003 |
| WO | 2004/061909 | 7/2004 |
| WO | 2004/061969 | 7/2004 |
| WO | 2005/064643 | 7/2005 |

OTHER PUBLICATIONS

EP Application 03726251.6, Office Action dated Sep. 15, 2010.
Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

(56) References Cited

OTHER PUBLICATIONS

Okamoto, K. et al., "Dislocation-Free m-Plane InGaN/GaN Light-Emitting Diodes on m-Plane GaN Single Crystals," Japanese Journal of Applied Physics, vol. 45, No. 45, 2006, pp. L1197-L1199.
Hiramatsu, K. et al., "Epitaxial lateral overgrowth techniques used in group III nitride epitaxy," J. Phys.: Condens. Matter 13, 2001, pp. 6961-6975.
European Office Action dated Feb. 2, 2009, Application No. 03 726 251.6.
European Office Action dated Feb. 16, 2009, Application No. 03 719 699.5.
European Office Action dated Aug. 4, 2009, Application No. 03 723 982.9.
Japanese Office Action dated Aug. 20, 2009, Application No. 2003-586401.
Japanese Office Action dated Mar. 27, 2009, Application No. 2003-586403.
Korean Office Action dated Mar. 3, 2010, Application No. 10-2004-7016455.
Korean Office Action dated Feb. 19, 2010, Application No. 10-2004-7016456.
International Search Report dated Aug. 26, 2003, Application No. PCT/US03/11175.
International Search Report dated Aug, 8, 2003, Application No. PCT/US03/11176.
International Search Report dated Aug. 21, 2003, Application No. PCT/US03/11177.
KR Office Action dated Nov. 23, 2010 (KR Application No. 10-2010-7019520) with English translation.
Shao, Y-P. et al., "Electrical Characterization of Semipolar Gallium Nitride Thin Films," NNIN REU Research Accomplishments, Aug. 2005, pp. 132-133.
Nichizuka, K., "Efficient Radiative Recombination From <1122>-oriented InxGa1-xN Multiple Quantum Wells Fabricated by the Regrowth Technique," Applied Physics Letters, Oct. 2004, vol. 85, No. 15, pp. 3122-3124, abstract.
Sharma, R., "Demonstration of a Semipolar (1013) InGaN/GaN Green Light Emitting Diode," Applied Physics Letters, Nov. 2005, vol. 87, 231110, pp. 1-3, abstract.
Amano, H., et. al., "Metalorganic vapor phase epitaxial growth of a high quality GaN film using an AlN buffer layer" Appl. Phys. Lett. 48 (5), Feb. 3, 1986, pp. 353-355.
Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.
Bottcher, T., et al., "The role of high-temperature island coalescence in the development of stresses in GaN films" Appl. Phys. Lett. 78 (14), Apr. 2, 2001, pp. 1976-1978.
Brandt, O., et al., "Determination of strain state and composition of highly mismatched group-III nitride heterostructures by x-ray diffraction" J. Phys. D. Appl. Phys. 35 (2002), pp. 577-585.
Craven, M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.
Craven, M.D., et al., "Threading dislocation reduction via laterally overgrown nonpolar (1120) a-plane GaN" Appl. Phys. Lett. 81 (7), Aug. 12, 2002, pp. 1201-1203.
Dovidenko, K., et. al., Characteristics of stacking faults in AlN thin films J Appl. Phys. 82 (9), Nov. 1, 1997, pp. 4296-4299.
Dupuis, R.D., et al., "Selective-area and lateral epitaxial overgrowth of III-N materials by metalorganic chemical vapor deposition" J. Crystal Growh, vol. 195, No. 1-4, Dec. 15, 1998, pp. 340-345.
Eastman, L.F., "The Toughest Transistor Yet" IEEE Spectrum 39 (5), May 2002, pp. 28-33.
Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.
Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.
Grandjean, N., et al., "Built-in electric-field effects in wurtzite AlGaN quantum wells" J. Appl. Phys. 86 (7), Oct. 1, 1999, pp. 3714-3720.
Heying, B., et al., "Role of threading dislocation structure on the x-ray diffraction peak widths in epitaxial GaN films" Appl. Phys. Lett. 68 (5), Jan. 29, 1996, pp. 643-645.
Im, J.S., et. al., "Reduction of oscillator strength due to piezoelectric fields in $G\beta N/Al_xG\beta_{1-x}N$ quantum wells" Phys. Rev. B. 57 (16), Apr. 15, 1998-II, pp. R9435-R9438.
Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L 661-L664.
Kapolnek, D., et al., "Anisotropic epitaxial lateral growth in GaN selective area epitaxy" Appl. Phys. Lett. 71 (9), Sep. 1, 1997, pp. 1204-1206.
Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.
Lefebvre, P., et al., "Time-resolved photoluminescence as a probe of internal electric fields in GaN-(GaAl)N quantum wells" Phys. Rev. B. 59 (23), Jun. 15, 1999—I, pp. 15363-15367.
Lei, T., "Heteroepitaxy, polymorphism, and faulting in GaN thin films on silicon and sapphire substrates" J. Appl. Phys. 74 (7), Oct. 1, 1993, pp. 4430-4437.
Leroux, M., "Barrier-width dependence of group-III nitrides quantum-well transition energies" Phys. Rev. B. 60 (3), Jul. 15, 1991—I, pp. 1496-1499.
Leszczynski, M., et. al., "Lattice parameters of gallium nitride" Appl. Phys. Lett. 69 (1), Jul. 1, 1996, pp. 73-75.
Liu, L. et al., "Substrates for gallium nitride epitaxy", Materials Science and Engineering R, Reports: A Review Journal, vol. 37, No. 3, Apr. 30, 2002, pp. 61-127.
Marchand, H., et al., "Microstructure of GaN laterally overgrown by metalorganic chemical vapor deposition" Appl. Phys. Lett.. 73 (6), Aug. 10, 1998, pp. 747-749.
Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.
Marchand, H., et al., "Mechanisms of lateral epitaxial overgrowth of gallium nitride by metalorganic chemical vapor deposition" J. of Crystal Growth, vol. 195, No. 1-4, Dec. 15, 1998, pp. 328-332.
Metzger, Th., et. al., "X-Ray Diffraction Study of Gallium Nitride Grown by MOCVD" Physica status solidi (b) 193, 1996, pp. 391-397.
Mills, A., "Wide-bandgap emitters continue to improve" III-V's Review, vol. 13, No. 3, May 2000, pp. 23-24, 26, 28-30.
Moustakas, T.D., et. al., "Growth of GaN by ECR-assisted MBE" Physica B 185, 1993, pp. 36-49.
Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.
Nakamura, S, et. al., "Violet InGaN/GaN/AlGaN-Based Laser Diodes Operable at 50° C. with a Fundamental Transverse Mode" Jpn. J. Appl. Phys. 38 (2), 1999, pp. L226-L229.
Nam, O., et. al., "Lateral epitaxy of low defect density GaN layers via organometallic vapor phase epitaxy" Appl. Phys. Lett. 71 (18), Nov. 3, 1997, pp. 2638-2640.
Nataf, G., et. al., "Lateral overgrowth of high quality GaN layers on $GaN/Al_2O_3$ patterned substrates by halide vapour-phase epitaxy" J. of Crystal Growth (192), Feb. 20, 1998, pp. 73-78.
Ng, H. M., "Molecular-beam epitaxy of $GaN/Al_xGa_{1-x}N$ multiple quantum wells on R-plane (1012) sapphire substrates" Appl. Phys. Lett. 80 (23), Jun. 10, 2002, pp. 4369-4371.
Nishida, T., et al., "Ten Milliwatt Operation of an AlGaN-Based Light Emitting Diode Grown on GaN Substrate" Phys. Stat. Sol. (a) 188 (1), 2001, pp. 113-116.

(56) References Cited

OTHER PUBLICATIONS

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Park, J., et. al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral growth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy- A new approach for lateral growth of gallium nitride structures" MRS Internet J. Nitride Semicond. Res. 4S1, G3.38 (1999).

Yu., Z., et. al., "Epitaxial lateral overgrowth of GaN on SiC and sapphire substrates" MRS Internet J. Nitride Semicond. Res. 4S1, G4.3 (1999).

Notice of Reasons for Rejection, Japanese Patent Application No. 2003-586402, dated Mar. 27, 2009.

Metzger et al., X-ray diffraction study of gallium nitride grown by MOCVD, Physica Status Solidi, B., Feb. 1, 1996, vol. 193, No. 2, pp. 391-397.

Srikant et al., "Mosaic structure in epitaxial thin films having large lattice mismatch," J. Appl. Phys., 1997, 82(9): 4286-4295.

Sun et al., "In surface segregation in M-plane (In,Ga)N/GaN multiple quantum well structures," Applied Physics Letters, vol. 83 No. 25 (Dec. 22, 2003).

Sun et al., "Nonpolar $In_xGa_{i-x}N$/GaN(1100) multiple quantum wells grown on $\gamma$-$LiAlO_2$(100) by plasma-assisted molecular-beam epitaxy," Physical Review B 67 (2003).

Takeuchi et al., "Theoretical study of orientation dependence of piezoelectric effects in wurtzite strained GaInN/GaN heterostructures and quantum wells," Jpn. J. Appl. Phys. vol. 39, pp. 413-416, Part 1, No. 2A (Feb. 2000).

Tanaka et al., "Anti-surfactant in III-nitride-epitaxy—quantum dot formation and dislocation termination," Jpn. J. Appl. Phys., 2000, 39: L831-L834.

Tanaka et al., "Self-assembling GaN quantum dots on $Al_xGa_{i-x}N$ surfaces using a surfactant," Appl. Phys. Lett., 1996, 69(26): 4096-4098.

Traetta et al., "Effects of the spontaneous polarization and piezoelectric fields on the luminescence spectra of $GaN/Al_{0.15}Ga_{0.85}N$ quantum wells", Physica E 7, 929-933 (2000).

Usui et al., "Thick GaN epitaxial growth with low dislocation density by hydride vapor phase epitaxy," Jpn. J. Appl. Phys., 1997, 36: L899-L902.

Vanfleet et al., "Defects in m-face GaN films grown in halide vapor phase epitaxy on $LiAlO_2$", Applied Physics Letters, vol. 83 No. 6 (Aug. 11, 2003).

Office Action mailed Jul. 2, 2007, U.S. Appl. No. 10/537,385, filed Jun. 3, 2005.

Office Action mailed Apr. 7, 2006, U.S. Appl. No. 10/537,644, filed Jun. 6, 2005.

Office Action mailed Aug. 14, 2007, U.S. Appl. No. 10/582,390, filed Jun. 9, 2006.

Office Action mailed May 29, 2008, U.S. Appl. No. 10/582,390, filed Jun. 9, 2006.

Office Action mailed Nov. 12, 2008, U.S. Appl. No. 10/582,390, filed Jun. 9, 2006.

Office Action mailed Jan. 18, 2006, U.S. Appl. No. 11/140,893, filed May 31, 2005.

Office Action mailed Jul. 14, 2006, U.S. Appl. No. 11/140,893, filed May 31, 2005.

Office Action mailed Jan. 3, 2007, U.S. Appl. No. 11/444,083, filed May 31, 2006.

Amano et al., "Stress and defect control in GaN using low temperature interlayers," Jpn. J. Appl. Phys., vol. 37 (1998).

Bernardini et al., "Spontaneous polarization and piezoelectric constants of III-V nitrides," Phys. Rev. B 56, R10024 (1997).

Bhattacharyya et al., "Comparative study of GaN/AlGaN MQWs grown homoepitaxially on (1 1 0 0) and (0001) GaN," Crystal Growth 251, 487 (2003).

Bigenwald et al., "Confined excitons in GaN—AlGaN quantum wells," Phys. Stat. Sol. (b) 216, 371 (1999).

Chakroborty et al., "Demonstration of nonpolar m-plane InGaN/GaN light-emitting diodes on free-standing m-plane GaN substrates," Japan J. Appl. Phys. 2005, vol. 44(5), pp. L173-L175.

Chakraborty et al., "Nonpolar InGaN/GaN emitters on reduced-defect lateral epitaxially overgrown a-plane GaN with drive-current-independent electroluminescence emission peak", Applied Physics Letters, vol. 85 No. 22, (Nov. 29, 2004).

Chen et al., "A new selective area lateral epitaxy approach for depositing $\alpha$-plane GaN over r-plane sapphire," Japan J. Appl. Phys. 2003, vol. 42 (part. 2, No. 7B), pp. L818-L820.

Chitnis et al., "Visible light-emitting diodes using a-plane GaN—InGaN multiple quantum wells over r-plane sapphire", Applied Physics Letters, vol. 84 No. 18 (May 3, 2004).

Funato et al., "Blue, green and amber InGaN/GaN light-emitting diodes on semipolar {11-22} GaN bulk substrates," Jap. Journal Appl. Phys., vol. 45, No. 26 (2006), pp. L659-L662 (abstract only).

Gardner et al., "Polarization anisotropy in the electroluminescence of m-plane InGaN—GaN multiple-quantum-well light-emitting diodes," Applied Physics Letters 86, 111101 (2005).

Gehrke et al., "Pendeo-epitaxy of gallium nitride and aluminum nitride films and heterostructure on silicon carbide substrate," MRS Internet J. Semicond. Res. 4S1, G3.2, 1999, 6 pp.

Ghandhi, "VLSI fabrication principles: silicon and gallium arsenide," $2^{nd}$ Edition, Wiley-Interscience, 1994, pp. 639-642.

Grandjean et al., "Self-limitation of AlGaN/GaN quantum well energy by built-in polarization field," Applied Physics Letters, vol. 74, No. 16 (Apr. 19, 1999).

(56) References Cited

OTHER PUBLICATIONS

Grzegory, et al., "Seeded growth of GaN at high $N_2$ pressure on (0 0 0 1) polar surfaces of GaN single crystalline substrates," Materials Science in Semiconductor Processing, vol. 4, No. 6, Dec. 2001, pp. 535-541.
Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.
Haskell et al., "Defect reduction in (1120) a-plane gallium nitride via lateral epitaxial overgrowth by hydride vapor-phase epitaxy," Applied Physics Letters, vol. 83 No. 4 (Jul. 28, 2003).
Iwaya et al., "Reduction of etch pit density in organometallic vapor phase epitaxy-grown GaN on sapphire by insertion of a low-temperature-deposited buffer layer between high-temperature-grown GaN," Jpn. J. Appl. Phys., 1998, 37: L316-L318.
Keller et al., "Metalorganic Chemical Vapor Deposition Growth of High Optical Quality and High Mobility GaN", J. Electronic Materials, vol. 24, pp. 1707-1709 (1995).
Keller et al., "Spiral growth of InGaN nanoscale islands on GaN," Jpn. J. Appl. Phys., 1998, 37: L431-L434.
Kinoshita et al, "Emission enhancement of GaN/AlGaN single-quantum-wells due to screening of piezoelectric field," MRS Internet J. Nitride Semicond. Res. 5, W11.32 (2000).
Kozodoy et al., "Electrical characterization of GaN p-n junctions with and without threading dislocations," Appl. Phys. Lett., 1998, 73(7): 975-977.
Kuokstis et al., "Polarization effects in photoluminescence of C- and M-plane GaN/AlGaN multiple quantum wells," Appl. Phys. Lett. 81, 4130 (2002).
"Kyma Technologies announces improved and expanded native gallium nitride product line," Mar. 20, 2006, Company News Releases, retrieved from http://www.compoundsemi.com/documents/articles/c1doc/6524.html.
Langer et al., "Giant electric fields in untrained GaN single quantum wells," Appl. Phys. Lett 74, 3827 (1999).
Leroux et al., "Quantum confined Stark effect due to built-in internal polarization fields in (Al,Ga)N/GaN quantum wells," Phys. Rev. B 58, R113371 (1998).
Maruska, et al., "Development of 50 mm diameter non-polar gallium nitride substrates for device applications," International Conference on Indium Phosphide and Related Materials, May 16, 2003, pp. 567-570.
McMahan, "Dr. Shuji Nakamura and UCSB research team report first nonpolar and semi-polar GaN LEDs," Compoundsemi Online, Mar. 24, 2006, one page.
Miller et al., "Electric field dependence of optical absorption near the band gap of quantum-well structures," the American Physical Society, Physical Review B, vol. 32, No. 2 (Jul. 15, 1985).
Moe et al., "Milliwatt power deep ultraviolet light emitting diodes grown on silicon carbide," Japan J. Appl. Phys. 2005, vol. 44(17), pp. L502-L504.
Monemar et al., "Properties of Zn-doped VPE-grown GaN.I.Luminescence data in relation to doping conditions," J. Appl. Phys. 51 (1), Jan. 1980, pp. 625-639.
Mukai et al., "Ultraviolet InGaN and GaN single-quantum-well-structure light-emitting diodes grown on epitaxially laterally overgrown GaN substrates," Jpn. J. Appl. Phys., vol. 38, pp. 5735-5739 (1999).
Nakamura et al., The Blue Laser Diode, (Springer, Heidelberg, 1997), pp. 160-178.
Nakamura et al., "InGaN/GaN/AlGaN-based laser diodes with modulation-doped strained-layer superlattices grown on an epitaxially laterally overgrown GaN substrate," Appl. Phys. Lett., 1998, 72(2): 211-213.
Neubert, "Growth characteristics of GaInN quantum wells on semipolar GaN facets," Annual Report 2005, Optoelectronics Department, University of Ulm 2006, pp. 1-6.
Ohba et al., "A study on strong memory effects for Mg doping in GaN metalorganic chemical vapor deposition," J. Cyst. Growth, vol. 145, 1994, pp. 214-218.

Parish et al., "High-performance (Al,Ga) N-based solar-blind ultraviolet p-i-n detectors on laterally epitaxially overgrown GaN," Appl. Phys. Lett., 1999, 75(2): 247-249.
Pearton et al., "GaN: Processing, defects, and devices," Applied Physics Reviews, Journal of Applied Physics, vol. 86, No. 1 (Jul. 1, 1999).
Craven, M.D., et al., "Structural characterization of nonpolar (1120) α-plane GaN thin films grown on (1102) r-plane sapphire", Applied Physics Letters, vol. 81, No. 3, Jul. 15, 2002, pp. 469-471, XP002250684.
Sasaki, T., et al., "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.
Sun, Chien-Jen, et al., "Comparison of the physical properties of GaN thin films deposited on (0001) and (0112) sapphire substrates", Applied Physics Letters, vol. 63, No. 7, 1993, pp. 973-975, XP002251480.
Waltereit et al., "M-Plane GaN(1 1 0 0) Grown on γ-LiAlO$_2$(1 0 0): Nitride Semiconductors Free of Internal Electrostatic Fields," Journal of Crystal Growth 227-228 (2001), pp. 437-441.
Ajoul et al., "Hydrogen and Nitrogen Ambient Effects on Epitaxial Growth of GaN by Hydride Vapour Phase Epitaxy," Journal of Crystal Growth 230 (2001), pp. 372-376.
Chen, C. et al., "GaN homoepitaxy on freestanding (1100) oriented GaN substrates," Applied Physics Letters, vol. 81, No. 17, Oct. 21, 2002, 3194.
EP Communication dated Aug. 23, 2011, Application No. 03 723 982.9.
JP Office Action dated Sep. 6, 2011, Patent Application No. 2008-514783.
Japanese Inquiry dated Jul. 1, 2011, Japanese Patent Application No. 2003-586402 (with translation).
Korean Office Action dated Jul. 28, 2011, Application No. 10-2010-7019520, with translation.
Korean Office Action dated Aug. 9, 2011 (Application No. 10-2004-7016456) with translation.
Kim, et al., "Microstructure of GaN films on sapphire surfaces with various orientations", Journal of Korean Association of Crystal Growth, vol. 9, No. 2 (1999), pp. 162-167.
Lim, et al., "Theoretical Calculation of SAW Propagation of GaN/Sapphire Structure according to SAW Propagation Direction", Journal of the Korean Ceramic Society, vol. 40, No. 6 (2003), pp. 539-546.
European Office Action dated Aug. 23, 2011 (Application No. 03723982.9).
Fini, P., "Threading dislocation reduction in gallium nitride thin films on sapphire via lateral epitaxial overgrowth," PhD Thesis, 2000.
Gilbart, P., "Metal organic vapour phase epitaxy of GaN and lateral growth," Rep. Prog. Phys. 67 (2004) 667-715.
Holec, D., "Multi scale modelling of III-nitrides: from dislocations to electronic structure," PhD Thesis, University of Cambridge, England, 2008.
Moran, B. et al., "Structural and morphological evolution of GaN grown by metalorganic chemical vapor deposition on SiC substrates using an AlN initial layer," Journal of Crystal Growth 273 (2004) 38-47.
Romanov, A. et al., "Stress relaxation in mismatched layers due to threading dislocation inclination," Applied Physics Letters, vol. 83, 13, Sep. 29, 2003, 2569.
Speck, J. et al., "Nonpolar and semipolar group III nitride-based materials," MRS Bulletin, vol. 34, May 2009, 304.
Speck, J. et al., "The role of threading dislocations in the physical properties of GaN and its alloys," Physica B, vol. 24 (1999) 24-32.
Wu, X. et al., "Dislocation generation in GaN heteroepitaxy," Journal of Crystal Growth 189/190 (1998) 231-243.
Notice of Allowance mailed on Jun. 28, 2012 for Korean Patent Application No. 10-2010-7019520 (Allowed claims appended).
Notice of Allowance mailed on Jun. 27, 2012 for Japanese Patent Application No. 2003-586402 (Allowed claims appended).
Office Action mailed on Jul. 10, 2012 for Japanese Patent Application No. 2009-181101.

(56) References Cited

OTHER PUBLICATIONS

Sasaki et al., "Substrate-orientation dependence of GaN single-crystal films grown by metalorganic vapor-phase epitaxy". Journal of Applied Physics, vol. 61, No. 7, (1987), pp. 2533-2540.

Craven et al., "Structural characterization of nonpolar (1120) a-plane GaN thin films grown on (1102) r-plane sapphire". Applied Physics Letters, vol. 81, No. 3, Jul. 15, 2002, pp. 469-471.

Lefebvre et al."High internal electric field in a graded-width InGaN/GaN quantum well: Accurate determination by time-resolved photoluminescence spectroscopy". Applied Physics Letters, vol. 78, No. 9, Feb. 26, 2001, pp. 1252-1254.

Korean Office Action dated Jul. 11, 2012 for KR application No. 10-2004-7016454.

Japanese Office Action dated Aug. 30, 2012, with English translation.

Japanese Office Action dated Jul. 3, 2012, Application No. 2009-181100, with English translation.

Craven, Michael D., "a-plane Oriented Gallium Nitride Thin Films: Heteroepitaxy, Quantum Wells, and Lateral Overgrowth". Dissertation, University of California Santa Barbara, Dec. 2003, 166 pages.

European Search Report dated Jun. 26, 2013, European Application No. 09010960.4.

Japanese Office Action (with English translation) dated Jun. 12, 2013 for Japanese Patent Application No. 2009-181101.

European Office Action dated Jun. 7, 2013 for European Patent Application No. 03726251.6.

Japanese Office Action (with English translation) dated Aug. 10, 2012 for Japanese Patent Application No. 2003-586403.

Japanese Office Action (with English translation) dated Oct. 23, 2013 for Japanese Patent Application No. 2009-181100.

Korean Notice of Re-examination Result Before Trial (with English translation) dated Feb. 4, 2014 for Korean Application No. 10-2011-7028367.

Japanese Office Action (with English translation) dated Mar. 13, 2014 for Japanese Patent Application No. 2010-250340.

Japanese Office Action (with English translation) and Japanese Denial of Entry of Amendment (with English translation) dated Jul. 1, 2014 for Japanese Patent Application No. 2009-181100.

Tran, C. A., et al., "Growth of InGaN/GaN multiple-quantum-well blue light-emitting diodes on silicon by metalorganic vapor phase epitaxy", Applied Physics Letters, vol. 75, No. 11, pp. 1494-1496, Sep. 13, 1999.

Tripathy, S., et al., "Optical properties of GaN layers grown on C-, A-, R-, and M-plane sapphire substrates by gas source molecular beam epitaxy", Journal of Applied Physics, vol. 85, No. 12, pp. 8386-8399, Jun. 15, 1999.

\* cited by examiner

NON-POLAR GALLIUM NITRIDE THIN FILMS GROWN BY METALORGANIC CHEMICAL VAPOR DEPOSITION

CROSS-REFERENCE TO RELATED APPLICATIONS

This application is a continuation under 35 U.S.C. Section 120 of commonly-assigned U.S. Utility patent application Ser. No. 10/413,691, filed on Apr. 15, 2003, now abandoned, by Michael D. Craven and James S. Speck, entitled "NON-POLAR A-PLANE GALLIUM NITRIDE THIN FILMS GROWN BY METALORGANIC CHEMICAL VAPOR DEPOSITION", which application claims the benefit under 35 U.S.C. §119(e) of the following commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, which application is incorporated by reference herein.

This application is related to the following commonly-assigned United States Utility patent applications:

Ser. No. 10/413,690, now U.S. Pat. No. 7,091,514, issued Aug. 15, 2006, entitled "NON-POLAR (AL,B,IN,GA)N QUANTUM WELL AND HETEROSTRUCTURE MATERIALS AND DEVICES," filed on Apr. 15, 2003, by Michael D. Craven, Stacia Keller, Steven P. DenBaars, Tal Margalith, James S. Speck, Shuji Nakamura, and Umesh K. Mishra; and Ser. No. 10/413,913, now U.S. Pat. No. 6,900,070, issued May 31, 2005, entitled "DISLOCATION REDUCTION IN NON-POLAR GALLIUM NITRIDE THIN FILMS," filed on Apr. 15, 2003, by Michael D. Craven, Steven P. DenBaars and James S. Speck;

both of which applications are incorporated by reference herein.

1. FIELD OF THE INVENTION

The invention is related to semiconductor materials, methods, and devices, and more particularly, to non-polar a-plane gallium nitride (GaN) thin films grown by metalorganic chemical vapor deposition (MOCVD).

2. DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

Polarization in wurtzite III-nitride compounds has attracted increased attention due to the large effect polarization-induced electric fields have on heterostructures commonly employed in nitride-based optoelectronic and electronic devices. Nitride-based optoelectronic and electronic devices are subject to polarization-induced effects because they employ nitride films grown in the polar c-direction [0001], the axis along which the spontaneous and piezoelectric polarization of nitride films are aligned. Since the total polarization of a nitride film depends on the composition and strain state, discontinuities exist at interfaces between adjacent device layers and are associated with fixed sheet charges that give rise to internal electric fields.

Polarization-induced electric fields, although advantageous for two-dimensional electron gas (2DEG) formation in nitride-based transistor structures, spatially separate electrons and hole wave functions in quantum well (QW) structures, thereby reducing carrier recombination efficiencies in QW based devices, such as laser diodes and light emitting diodes. See References 1. A corresponding reduction in oscillator strength and red-shift of optical transitions have been reported for AlGaN/GaN and GaN/InGaN quantum wells grown along the GaN c-axis. See References 2-7.

A potential means of eliminating the effects of these polarization-induced fields is through the growth of structures in directions perpendicular to the GaN c-axis (non-polar) direction. For example, m-plane AlGaN/GaN quantum wells have recently been grown on lithium aluminate substrates via plasma-assisted molecular beam epitaxy (MBE) without the presence of polarization-induced electric fields along the growth direction. See Reference 8.

Growth of a-plane nitride semiconductors also provides a means of eliminating polarization-induced electric field effects in wurtzite nitride quantum structures. For example, in the prior art, a-plane GaN growth had been achieved on r-plane sapphire via MOCVD and molecular beam epitaxy (MBE). See References 9-15. However, the film growth reported by these early efforts did not utilize a low temperature buffer layer and did not possess smooth planar surfaces, and therefore, these layers were poorly suited for heterostructure growth and analysis. Consequently, there is a need for improved methods of growing films that exhibit improved surface and structural quality as compared to previously reported growth of GaN on r-plane sapphire via MOCVD.

SUMMARY OF THE INVENTION

The present invention describes a method for growing device-quality non-polar a-plane GaN thin films via MOCVD on r-plane sapphire substrates. The present invention provides a pathway to nitride-based devices free from polarization-induced effects, since the growth direction of non-polar a-plane GaN thin films is perpendicular to the polar c-axis. Polarization-induced electric fields will have minimal effects, if any, on (Al,B,In,Ga)N device layers grown on non-polar a-plane GaN thin films.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a method for growing device quality non-polar (11$\bar{2}$0) a-plane GaN thin films via MOCVD on (1$\bar{1}$02) r-plane sapphire substrates. The method employs a low-temperature buffer layer grown at atmospheric pressure to initiate the GaN growth on r-plane sapphire. Thereafter, a high temperature growth step is performed at low pressures, e.g., ~0.1 atmospheres (atm) in order to produce a planar film.

Planar growth surfaces have been achieved using the present invention. Specifically, the in-plane orientation of the GaN with respect to the r-plane sapphire substrate has been confirmed to be $[0001]_{GaN} \| [\bar{1}101]_{sapphire}$ and $[\bar{1}100]_{GaN} \| [11\bar{2}0]_{sapphire}$.

The resulting films possess surfaces that are suitable for subsequent growth of (Al,B,In,Ga)N device layers. Specifically, polarization-induced electric fields will have minimal effects, if any, on (Al,B,In,Ga)N device layers grown on non-polar a-plane GaN base layers.

Process Steps

Figure 1:
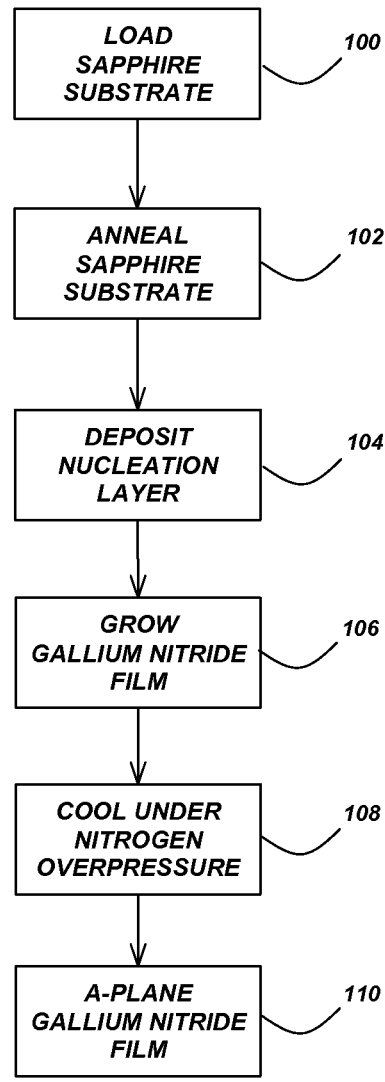
FIG. 1 is a flowchart that illustrates the steps of the MOCVD process for the growth of non-polar (11$\bar{2}$0) a-plane GaN thin films on (1$\bar{1}$20) r-plane sapphire, according to the preferred embodiment of the present invention.

FIG. 1 is a flowchart that illustrates the steps of the MOCVD process for the growth of non-polar (11$\bar{2}$0) a-plane GaN thin films on a (1$\bar{1}$20) r-plane sapphire substrate, according to the preferred embodiment of the present invention. The growth process was modeled after the two-step process that has become the standard for the growth of c-GaN on c-sapphire. See Reference 16.

Block 100 represents loading of a sapphire substrate into a vertical, close-spaced, rotating disk, MOCVD reactor. For this step, epi-ready sapphire substrates with surfaces crystallographically oriented within +/−2° of the sapphire r-plane (1$\bar{1}$20) may be obtained from commercial vendors. No ex-situ preparations need be performed prior to loading the sapphire substrate into the MOCVD reactor, although ex-situ cleaning of the sapphire substrate could be used as a precautionary measure.

Block 102 represents annealing the sapphire substrate in-situ at a high temperature (>1000° C.), which improves the quality of the substrate surface on the atomic scale. After annealing, the substrate temperature is reduced for the subsequent low temperature nucleation layer deposition.

Block 104 represents depositing a thin, low temperature, low pressure, nitride-based nucleation layer as a buffer layer on the sapphire substrate. In the preferred embodiment, the nucleation layer is comprised of, but is not limited to, 1-100 nanometers (nm) of GaN and is deposited at low temperature, low pressure depositing conditions of approximately 400-900° C. and 1 atm. Such layers are commonly used in the heteroepitaxial growth of c-plane (0001) nitride semiconductors. Specifically, this depositing step initiates GaN growth on the r-plane sapphire substrate.

After depositing the nucleation layer, the reactor temperature is raised to a high temperature, and Block 106 represents growing the non-polar (11$\bar{2}$0) a-plane GaN thin films on the substrate. In the preferred embodiment, the high temperature growth conditions comprise, but are not limited to, approximately 1100° C. growth temperature, approximately 0.2 atm or less growth pressure, 30 μmol per minute Ga flow, and 40,000 μmol per minute N flow, thereby providing a V/III ratio of approximately 1300). In the preferred embodiment, the precursors used as the group III and group V sources are trimethylgallium and ammonia, respectively, although alternative precursors could be used as well. In addition, growth conditions may be varied to produce different growth rates, e.g., between 5 and 9 Å per second, without departing from the scope of the present invention. Non-polar GaN approximately 1.5 μm thick have been grown and characterized.

Upon completion of the high temperature growth step, Block 108 represents cooling the non-polar (11$\bar{2}$0) a-plane GaN thin films under a nitrogen overpressure.

Finally, Block 110 represents the end result of the processing steps, which is a non-polar (11$\bar{2}$0) a-plane GaN film on an r-plane sapphire substrate. Potential device layers to be manufactured using these process steps to form a non-polar (11$\bar{2}$0) a-plane GaN base layer for subsequent device growth include laser diodes (LDs), light emitting diodes (LEDs), resonant cavity LEDs (RC-LEDs), vertical cavity surface emitting lasers (VCSELs), high electron mobility transistors (HEMTs), heterojunction bipolar transistors (HBTs), heterojunction field effect transistors (HFETs), and UV and near-UV photodetectors.

Experimental Results

The crystallographic orientation and structural quality of the as-grown GaN films and r-plane sapphire were determined using a Philips™ four-circle, high-resolution, x-ray diffractometer (HR-XRD) operating in receiving slit mode with four bounce Ge(220)-monochromated Cu K$\alpha$ radiation and a 1.2 mm slit on the detector arm. Convergent beam electron diffraction (CBED) was used to determine the polarity of the a-GaN films with respect to the sapphire substrate. Plan-view and cross-section transmission electron microscopy (TEM) samples, prepared by wedge polishing and ion milling, were analyzed to define the defect structure of a-GaN. A Digital Instruments D3000 Atomic Force Microscope (AFM) in tapping mode produced images of the surface morphology.

Figure 2:
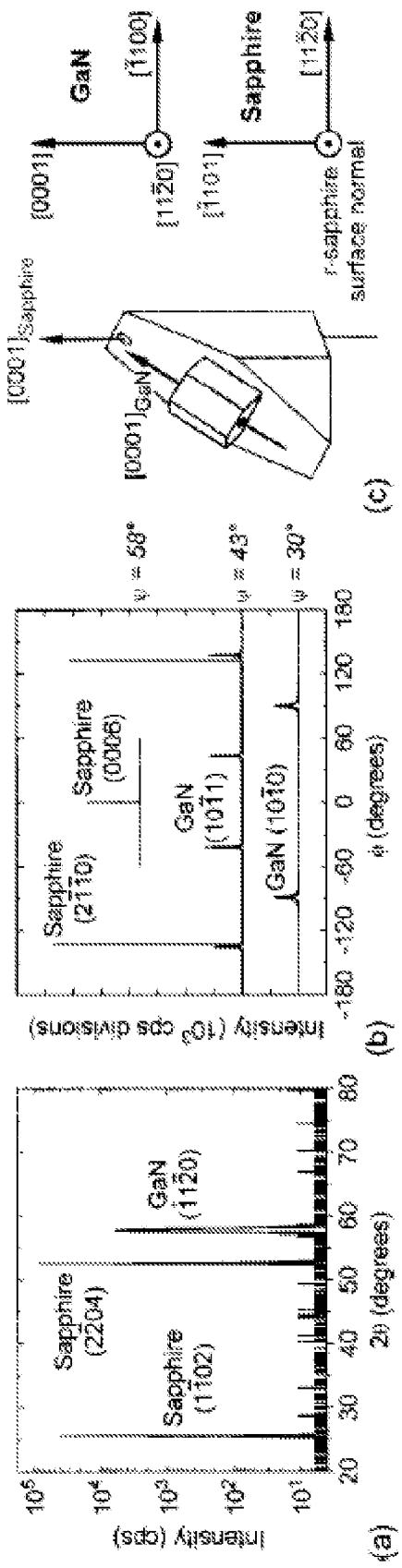
FIG. 2(a) shows a 2θ-ω diffraction scan that identifies the growth direction of the GaN film as (11$\bar{2}$0) a-plane GaN.
FIG. 2(b) is a compilation of off-axis φ scans used to determine the in-plane epitaxial relationship between GaN and r-sapphire, wherein the angle of inclination ψ used to access the off-axis reflections is noted for each scan.
FIG. 2(c) is a schematic illustration of the epitaxial relationship between the GaN and r-plane sapphire.

FIG. 2($a$) shows a 2θ-ω diffraction scan that identifies the growth direction of the GaN film as (11$\bar{2}$0) a-plane GaN. The scan detected sapphire (1$\bar{1}$02), (2$\bar{2}$04), and GaN (11$\bar{2}$0) reflections. Within the sensitivity of these measurements, no GaN (0002) reflections corresponding to 2θ=34.604° were detected, indicating that there is no c-plane (0002) content present in these films, and thus instabilities in the GaN growth orientation are not a concern.

FIG. 2($b$) is a compilation of off-axis φ scans used to determine the in-plane epitaxial relationship between GaN and r-sapphire, wherein the angle of inclination ψ used to access the off-axis reflections is noted for each scan. Having confirmed the a-plane growth surface, off-axis diffraction peaks were used to determine the in-epitaxial relationship between the GaN and the r-sapphire. Two sample rotations φ and ψ were adjusted in order to bring off-axis reflections into the scattering plane of the diffractometer, wherein φ is the angle of rotation about the sample surface normal and ψ is the angle of sample tilt about the axis formed by the intersection of the Bragg and scattering planes. After tilting the sample to the correct ψ for a particular off-axis reflection, φ scans detected GaN (1010), (1011), and sapphire (0006) peaks, as shown in FIG. 2($b$). The correlation between the φ positions of these peaks determined the following epitaxial relationship: $[0001]_{GaN} \| [\bar{1}101]_{sapphire}$ and $[\bar{1}100]_{GaN} \| [11\bar{2}0]_{sapphire}$.

FIG. 2($c$) is a schematic illustration of the epitaxial relationship between the GaN and r-plane sapphire. To complement the x-ray analysis of the crystallographic orientation, the a-GaN polarity was determined using CBED. The polarity's sign is defined by the direction of the polar Ga—N bonds aligned along the GaN c-axis; the positive c-axis [0001] points from a gallium atom to a nitrogen atom. Consequently, a gallium-face c-GaN film has a [0001] growth direction, while a nitrogen-face c-GaN crystal has a [000$\bar{1}$] growth direction. For a-GaN grown on r-sapphire, $[0001]_{GaN}$ is aligned with the sapphire c-axis projection $[\bar{1}101]_{sapphire}$, and therefore, the epitaxial relationships defined above are accurate in terms of polarity. Consequently, the positive GaN c-axis points in same direction as the sapphire c-axis projection on the growth surface (as determined via CBED). This relationship concurs with the epitaxial relationships previously reported by groups using a variety of growth techniques. See References 9, 12 and 14. Therefore, the epitaxial relationship is specifically defined for the growth of GaN on an r-plane sapphire substrate.

Figure 3:
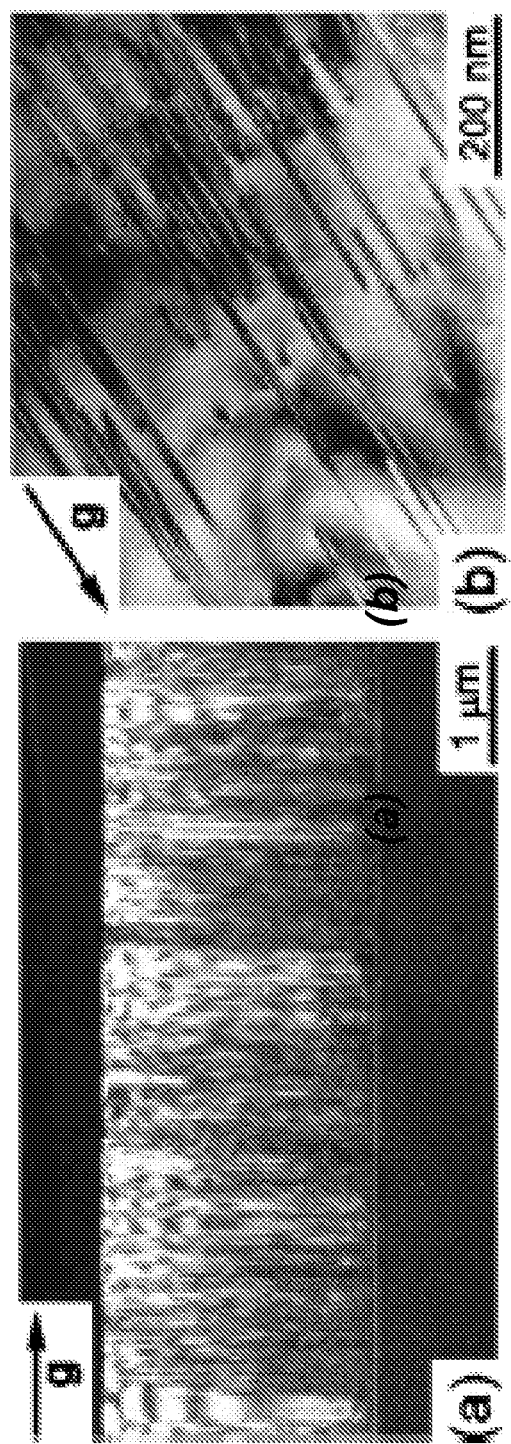
FIGS. 3(a) and 3(b) are cross-sectional and plan-view transmission electron microscopy (TEM) images, respectively, of the defect structure of the a-plane GaN films on r-plane sapphire.

FIGS. 3(a) and 3(b) are cross-sectional and plan-view TEM images, respectively, of the defect structure of the a-plane GaN films on an r-plane sapphire substrate. These images reveal the presence of line and planar defects, respectively. The diffraction conditions for FIGS. 3(a) and 3(b) are g=0002 and g=10$\bar{1}$0, respectively.

The cross-sectional TEM image in FIG. 3(a) reveals a large density of threading dislocations (TD's) originating at the sapphire/GaN interface with line directions parallel to the growth direction [11$\bar{2}$0]. The TD density, determined by plan view TEM, was $2.6 \times 10^{10}$ cm$^{-2}$. With the TD line direction parallel to the growth direction, pure screw dislocations will have Burgers vectors aligned along the growth direction b=±[11$\bar{2}$0]) while pure edge dislocations will have b=±[0001]. The reduced symmetry of the a-GaN surface with respect to c-GaN complicates the characterization of mixed dislocations since the crystallographically equivalent [11$\bar{2}$0] directions cannot be treated as the family <11$\bar{2}$0>. Specifically, the possible Burgers vectors of mixed dislocations can be divided into three subdivisions: (1) b=±[1$\bar{2}$10] b= and (3) b=±[$\bar{2}$110], (2) b=±[11$\bar{2}$0]±[0001], and (3) b=±[11$\bar{2}$0]±[1$\bar{2}$10] and b=±[11$\bar{2}$0]±[$\bar{2}$110].

In addition to line defects, the plan view TEM image in FIG. 3(b) reveals the planar defects observed in the a-GaN films. Stacking faults aligned perpendicular to the c-axis with a density of $3.8 \times 10^5$ cm$^{-1}$ were observed in the plan-view TEM images. The stacking faults, commonly associated with epitaxial growth of close-packed planes, most likely originate on the c-plane sidewalls of three-dimensional (3D) islands that form during the initial stages of the high temperature growth. Consequently, the stacking faults are currently assumed to be intrinsic and terminated by Shockley partial dislocations of opposite sign. Stacking faults with similar characteristics were observed in a-plane AlN films grown on r-plane sapphire substrates. See Reference 17. The stacking faults have a common faulting plane parallel to the close-packed (0001) and a density of ~$3.8 \times 10^5$ cm$^{-1}$.

Omega rocking curves were measured for both the GaN on-axis (11$\bar{2}$0) and off-axis (10$\bar{1}$1) reflections to characterize the a-plane GaN crystal quality. The full-width half-maximum (FWHM) of the on-axis peak was 0.29° (1037″), while the off-axis peak exhibited a larger orientational spread with a FWHM of 0.46° (1659″). The large FWHM values are expected since the microstructure contains a substantial dislocation density. According to the analysis presented by Heying et al. for c-GaN films on c-sapphire, on-axis peak widths are broadened by screw and mixed dislocations, while off-axis widths are broadened by edge-component TD's (assuming the TD line is parallel to the film normal). See Reference 18. A relatively large edge dislocation density is expected for a-GaN on r-sapphire due to the broadening of the off-axis peak compared to the on-axis peak. Additional microstructural analyses are required to correlate a-GaN TD geometry to rocking curve measurements.

Figure 4:
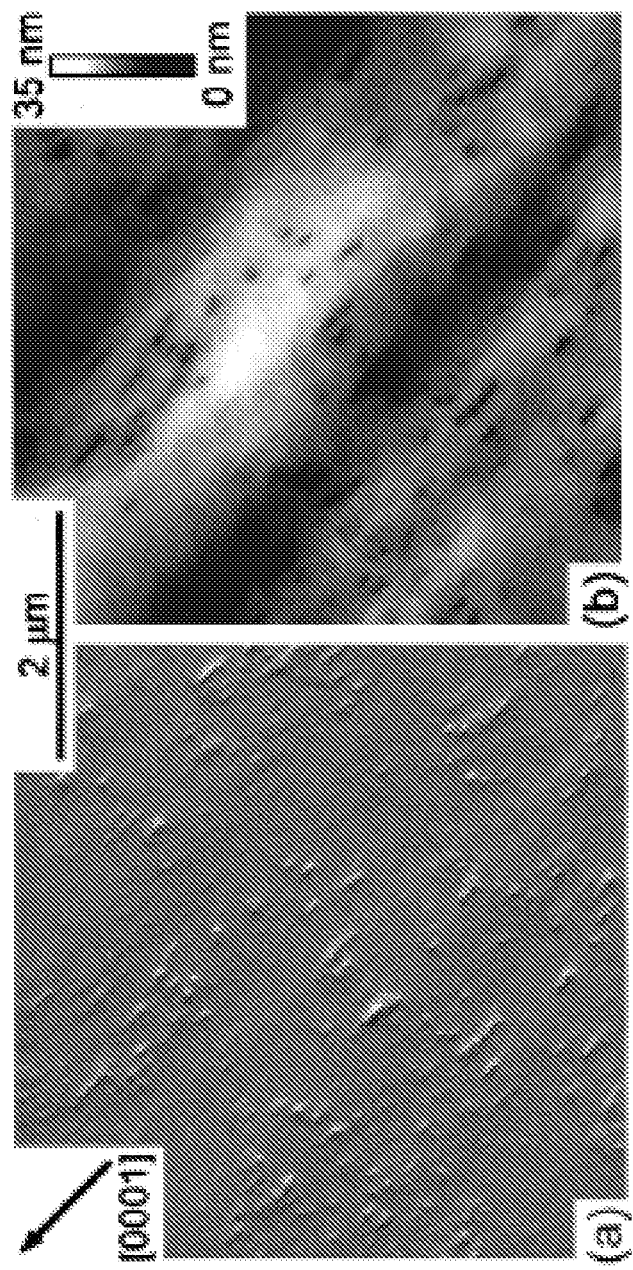
FIGS. 4(a) and 4(b) are atomic force microscopy (AFM) amplitude and height images, respectively, of the surface of the as-grown a-plane GaN films.

FIGS. 4(a) and 4(b) are AFM amplitude and height images, respectively, of the surface of the as-grown a-plane GaN film. The surface pits in the AFM amplitude image of FIG. 4(a) are uniformly aligned parallel to the GaN c-axis, while the terraces visible in the AFM height image of FIG. 4(b) are aligned perpendicular to the c-axis.

Although optically specular with a surface RMS roughness of 2.6 nm, the a-GaN growth surface is pitted on a sub-micron scale, as can be clearly observed in the AFM amplitude image shown in FIG. 4(a). It has been proposed that the surface pits are decorating dislocation terminations with the surface; the dislocation density determined by plan view TEM correlates with the surface pit density within an order of magnitude.

In addition to small surface pits aligned along GaN c-axis [0001], the AFM height image in FIG. 4(b) reveals faint terraces perpendicular to the c-axis. Although the seams are not clearly defined atomic steps, these crystallographic features could be the early signs of the surface growth mode. At this early point in the development of the a-plane growth process, neither the pits nor the terraces have been correlated to particular defect structures.

REFERENCES

The following references are incorporated by reference herein:

1. I. P. Smorchkova, C. R. Elsass, J. P. Ibbetson, R. Vetury, B. Heying, P. Fini, E. Haus, S. P. DenBaars, J. S. Speck, and U. K. Mishra, J. Appl. Phys. 86, 4520 (1999).
2. O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, J. Appl. Phys. 85, 3222 (1999).
3. I. Jin Seo, H. Kollmer, J. Off, A. Sohmer, F. Scholz, and A. Hangleiter, Phys. Rev. B 57, R9435 (1998).
4. R. Langer, J. Simon, V. Ortiz, N. T. Pelekanos, A. Barski, R. Andre, and M. Godlewski, Appl. Phys. Lett. 74, 3827 (1999).
5. P. Lefebvre, J. Allegre, B. Gil, H. Mathieu, N. Grandjean, M. Leroux, J. Massies, and P. Bigenwald, Phys. Rev. B 59, 15363 (1999).
6. P. Lefebvre, A. Morel, M. Gallart, T. Taliercio, J. Allegre, B. Gil, H. Mathieu, B. Damilano, N. Grandjean, and J. Massies, Appl. Phys. Lett. 78, 1252 (2001).
7. T. Takeuchi, C. Wetzel, S. Yamaguchi, H. Sakai, H. Amano, I. Akasaki, Y. Kaneko, S. Nakagawa, Y. Yamaoka, and N. Yamada, Appl. Phys. Lett. 73, 1691 (1998).
8. P. Waltereit, O. Brandt, A. Trampert, H. T. Grahn, J. Menniger, M. Ramsteiner, M. Reiche, and K. H. Ploog, Nature (London 406, 865 (2000).
9. T. Sasaki and S. Zembutsu, J. Appl. Phys. 61, 2533 (1987).
10. C. J. Sun and M. Razeghi, Appl. Phys. Lett. 63, 973 (1993).
11. T. Metzger, H. Angerer, O. Ambacher, M. Stutzmann, and E. Born, Phys. Status Solidi B 193, 391 (1996).
12. T. Lei, K. F. Ludwig, Jr., and T. D. Moustakas, J. Appl. Phys. 74, 4430 (1993).
13. C. R. Eddy, Jr., T. D. Moustakas, and J. Scanlon, J. Appl. Phys. 73, 448 (1993).
14. T. D. Moustakas, T. Lei, and R. J. Molnar, Physica B 185, 36 (1993).

15. K. Iwata, H. Asahi, K. Asami, R. Kuroiwa, and S. Gonda, Jpn. J. Appl. Phys., Part 2 36, L661 (1997).
16. H. Amano, N. Sawaki, I. Akasaki, and Y. Toyoda, Appl. Phys. Lett. 48, 353 (1986).
17. K. Dovidenko, S. Oktyabrsky, and J. Narayan, J. Appl. Phys. 82, 4296 (1997).
18. B. Heying, X. H. Wu, A. S. Keller, Y. Li, D. Kapolnek, B. P. Keller, S. P. DenBaars, and J. S. Speck, Appl. Phys. Lett. 68, 643 (1996).

CONCLUSION

This concludes the description of the preferred embodiment of the present invention. The following describes some alternative embodiments for accomplishing the present invention.

For example, as the inclusions in the description above indicate, there are many modifications and variations of the MOCVD technique and equipment that could be used to grow non-polar (11$\bar{2}$0) a-plane GaN thin films on (1$\bar{1}$02) r-plane sapphire substrates. Moreover, different growth conditions may be optimal for different MOCVD reactor designs. Many variations of this process are possible with the variety of reactor designs currently being using in industry and academia. Despite these differences, the growth parameters can most likely be optimized to improve the quality of the films. The most important variables for the MOCVD growth include growth temperature, V/III ratio, precursor flows, and growth pressure.

In addition to the numerous modifications possible with the MOCVD growth technique, other modifications are possible. For example, the specific crystallographic orientation of the r-plane sapphire substrate might be changed in order to optimize the subsequent epitaxial GaN growth. Further, r-plane sapphire substrates with a particular degree of miscut in a particular crystallographic direction might be optimal for growth.

In addition, the nucleation layer deposition is crucial to achieving epitaxial GaN films with smooth growth surfaces and minimal crystalline defects. Other than optimizing the fundamental MOCVD parameters, use of AlN or AlGaN nucleation layers in place of GaN could prove useful in obtaining high quality a-plane GaN films.

Further, although non-polar a-plan GaN thin films are described herein, the same techniques are applicable to non-polar m-plane GaN thin films. Moreover, non-polar InN, AlN, and AlInGaN thin films could be created instead of GaN thin films.

Finally, substrates other than sapphire substrate could be employed for non-polar GaN growth. These substrates include silicon carbide, gallium nitride, silicon, zinc oxide, boron nitride, lithium aluminate, lithium niobate, germanium, aluminum nitride, and lithium gallate.

In summary, the present invention describes the growth of non-polar (11$\bar{2}$0) a-plane GaN thin films on r-plane (1$\bar{1}$02) sapphire substrates by employing a low temperature nucleation layer as a buffer layer prior to a high temperature growth of the epitaxial (11$\bar{2}$0) a-plane GaN GaN films. The epitaxial relationship is $[0001]_{GaN}\|[\bar{1}101]_{sapphire}$ and $[\bar{1}100]_{GaN}\|[11\bar{2}0]_{sapphire}$ with the positive GaN c-axis pointing in the same direction as the sapphire c-axis projection on the growth surface.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of growing non-polar Gallium Nitride (GaN), comprising:
   growing GaN, including a non-polar a-plane GaN film, on an r-plane of a sapphire substrate using metalorganic chemical vapor deposition (MOCVD) and growth conditions including growth temperature, growth pressure, and a V/III ratio, including:
   (a) depositing a GaN layer on the r-plane sapphire substrate at a first growth temperature between 400° C. and 900° C. and at atmospheric pressure; and
   (b) growing the non-polar a-plane GaN film on the GaN layer at a growth pressure of 0.2 atmospheres or less, at the growth temperature higher than the first growth temperature, and using a V/III ratio of ~1300, wherein:
   the non-polar a-plane GaN film has:
   a crystalline quality characterized by an on-axis Omega rocking curve having a full-width half-maximum (FWHM) of no more than 0.29° (1037") and an off-axis Omega rocking curve having a FWHM of no more than 0.46° (1659"),
   a threading dislocation density of no more than $2.6 \times 10^{10}$ cm$^{-2}$,
   a threading dislocation line direction parallel to a film normal of the non-polar a-plane GaN film,
   stacking faults aligned perpendicular to a c-axis of the non-polar a-plane GaN film with a stacking fault density of no more than $3.8 \times 10^5$ cm$^{-1}$,
   a top surface with a surface roughness of no more than 2.6 nanometers (nm) over an area of 5 micrometers by 5 micrometers, and
   surface pitting on a sub-micron scale with a density within an order of magnitude of the threading dislocation density.

2. The method of claim 1, wherein the non-polar a-plane GaN film comprises a coalesced film and has a wurtzite structure.

3. The method of claim 1, wherein the non-polar a-plane GaN film has a planar top surface.

4. The method of claim 1, wherein the non-polar a-plane GaN film is suitable for subsequent growth of device-quality III-nitride layers.

5. The method of claim 1, wherein the non-polar a-plane GaN film has a top surface that is a device substrate or base for subsequent growth of non-polar III-nitride device layers on the top surface of the non-polar a-plane GaN film.

6. The method of claim 1, wherein the GaN layer is a nucleation and/or buffer layer.

7. The method of claim 1, wherein
the growth temperature for the non-polar a-plane GaN film is about 1100° C.

8. The method of claim 1, wherein the growth conditions and the substrate obtain the non-polar a-plane GaN film having no c-plane content.

9. The method of claim 1, wherein the stacking fault density is at the top surface.

10. The method of claim 1, wherein the growth conditions obtain the non-polar a-plane GaN film with a stable a-plane orientation.

11. The method of claim 1, wherein the non-polar a-plane GaN film includes a thickness of 1.5 micrometers.

12. The method of claim 11, wherein the GaN layer is a buffer layer and/or nucleation layer having at thickness of 1-100 nanometers.

13. The method of claim 1, wherein growing the non-polar a-plane GaN film includes using 30 μmol per minute Ga flow and 40,000 μmol per minute N flow, thereby providing a V/III ratio of approximately 1300.

* * * * *